United States Patent

Weiss et al.

[11] Patent Number: 6,133,540
[45] Date of Patent: Oct. 17, 2000

[54] APPARATUS AND METHOD FOR PRODUCING PUNCH PIN WITH SPHERICAL HEAD

[75] Inventors: Thomas Weiss, Poughquag; John U. Knickerbocker, Hopewell Junction; Mark J. LaPlante, Walden; David C. Long, Wappingers, all of N.Y.

[73] Assignee: International Business Machines Corporation, Armonk, N.Y.

[21] Appl. No.: 09/128,446

[22] Filed: Aug. 3, 1998

[51] Int. Cl.$^7$ .............................. B23K 11/16; B23K 9/04
[52] U.S. Cl. .................... 219/56; 219/56.1; 219/56.22
[58] Field of Search ................. 219/56, 56.1, 56.21, 219/56.22

[56] References Cited

U.S. PATENT DOCUMENTS

| | | | |
|---|---|---|---|
| 4,950,866 | 8/1990 | Kojima et al. | 219/56.22 |
| 5,095,187 | 3/1992 | Gliga | 219/56.21 |
| 5,226,582 | 7/1993 | Kubota | 219/56.22 |
| 5,616,257 | 4/1997 | Harada | 219/56.21 |
| 5,763,849 | 6/1998 | Nakao | 219/56.21 |
| 5,957,371 | 9/1999 | Miyano et al. | 219/56.22 |
| 5,958,259 | 9/1999 | Miyano et al. | 219/56.22 |

OTHER PUBLICATIONS

"Punch Programming Mechanism", A.F. Coneski, et al., IBM Technical Disclosure Bulletin, vol. 26, No. 10A, Mar. 1984.

"Gang Punch For Soft Workpieces", E.S. Pearson, IBM Technical Disclosure Bulletin, vol. 19, No. 4, Sep. 1976.

"'Air Spring' Programmable Via Punching Head", J. R. Kranik and W.F. Mueller, IBM Technical Disclosure Bulletin, vol. 16, No. 12, May 1974.

"Progressive Gang Punch", J.R. Kranik and B.C. O'Neill, IBM Technical Disclosure Bulletin, vol. 15, No. 2, Jul. 1972.

*Primary Examiner*—Patrick Ryan
*Assistant Examiner*—Anjan Dey
*Attorney, Agent, or Firm*—DeLio & Peterson, LLC; John J. Tomaszewski; Tiffany L. Townsend

[57] ABSTRACT

An apparatus and method is provided for forming a punch retaining ball at the end of a wire to form a headed punch pin for making vias in greensheets comprising advancing the wire through a die, contacting the end of the wire with a movable electrode which forms the ball by completing an electrical circuit with the wire and the electrode, after which the wire is retracted so that the formed punch pin is restrained from movement by the die and is cut forming the punch pin. A formed punch pin collection device is also provided as is a defective punch pin removal device. After the formation and removal from the apparatus of a formed punch pin or a reject defective punch pin, the apparatus is moved to its starting position and again activated to advance the wire through the die and the above procedure repeated.

14 Claims, 10 Drawing Sheets

APPARATUS AND METHOD FOR PRODUCING PUNCH PIN WITH SPHERICAL HEAD

CROSS-REFERENCE TO RELATED APPLICATIONS

Aspects of the present invention are related to subject matter disclosed in co-pending applications entitled Low-Cost High-Density Gang Punch and Gang Punch Tool Assembly both co-pending applications filed on even date herewith and both assigned to the same assignee as the present invention.

BACKGROUND OF THE INVENTION

1. Field of the Invention

This invention relates to a gang-punch or other punch apparatus and method for punching holes in thin sheet material such as ceramic greensheets used in multilayer ceramic electronic component fabrication and, more particularly, to punch pins for use with the apparatus and a method and apparatus for making the punch pins.

2. Description of Related Art

In the manufacture of multilayer ceramic (MLC) substrates for integrated circuit semiconductor package structures, a plurality of green ceramic sheets (commonly termed greensheets) is formed by doctor blading a slurry containing a resin binder, a particulate ceramic material, solvents and a plasticizer, drying the doctor bladed sheet and cutting it into appropriate size sheets. Holes, commonly termed vias, are then punched in the greensheets to facilitate performing electrical interconnections through the sheet. Electrically conductive paste is deposited in the holes and in appropriate circuitry patterns on the surface of the greensheets, the sheets stacked and laminated, and the assembly subsequently fired at a sintering temperature.

The formation of the vias in the ceramic material is accomplished in its green state. Prior to being fired, the greensheets are easily deformed and the precision with which the via holes are formed is greatly dependent upon the use of apparatus which minimize distortion or disruption to the structural integrity of the greensheet other than forming the via hole. With the size of electrical components constantly being reduced through technical improvement the positioning of the via holes in the ceramic greensheets is becoming ever more restrictive. Further, with the increase in the quantity of the electronic circuits needed to make the electronic component package, the requirement for a larger number of vias per unit area of substrate is evident.

Large numbers of holes must be punched into a greensheet with a high degree of precision in order to properly position the hole. At the same time, this punching operation must occur very rapidly in order to produce the large numbers of greensheets that are necessary in the mass production of multilayer ceramic electronic components.

A significant portion of the costs associated in manufacturing ceramic packages can be attributed to that of punching vias in greensheets. The following factors play a major role in accounting for these costs: 1) the high cost for punch/die sets customized to a specific product; 2) customized punch/die sets steps/repeats numerous times up to several thousand cycles to punch a single sheet, resulting in low throughput; 3) non-customized punch die sets have very low throughput for non-grid product (up to 20 k cycles per sheet); and 4) the long lead-time associated with customized punch die set fabrication precludes early introduction of a new product.

One method for punching greensheets is using a gang-punch apparatus. A gang-punch is a punch/die set where all the punches for a particular ceramic greensheet layer are rigidly and permanently mounted in a rigid plate. This mounting may be accomplished using adhesive (epoxies, etc.) or press fitting. This permanent mounting makes punch placement to repair broken or worn punches difficult and expensive. The gang-punch is used to punch the entire sheet (layer) with a single stroke. A gang-punch has very high throughput and is cost effective for very high volume products.

A number of attempts have been made to provide "gang-punch" apparatus which will economically and efficiently provide the means to make via openings in greensheets. One type apparatus utilizes an interposer mask which contains hole openings where holes are desired to be punched. In these types apparatus, a plurality of punch elements arranged in a grid are arranged over the greensheet which is covered by the interposer mask. When the punch elements contact the interposer mask as the punch head is moved downwardly, the hole will be punched where the openings occur since the punch element would pass through the openings in the interposer mask and through the ceramic greensheet. In other areas covered by interposer mask, i.e., where holes are not desired, the interposer mask will cause the punch element to be retracted into the head. Such apparatus are shown in IBM Technical Disclosure Bulletins, Vol. 16, No. 12, May 1974; Vol. 19, No. 4, September 1976 and Vol. 26, No. 10A, March 1984. Other punch apparatus are shown in U.S. Pat. Nos. 4,872,381; 4,425,829; 5,024,127; 5,090,284; and 5,233,895. In U.S. Pat. No. 4,872,381, supra, for example, a programmable magnetic repulsion punching apparatus is shown. A progressive gang-punch is shown in IBM Technical Disclosure Bulletin Vol. 15, No. 2, July 1972 wherein a gang-punch is shown utilizing steel balls at locations of punches to be punched on the surface of the punch head which when a roller traverses the top of the punch head vias are punched only where steel balls are located. The disclosures of the above publications and patents are hereby incorporated by reference.

A significant factor in the cost of gang-punching is the cost of the punch pins since thousands of punch pins are typically needed for use with a gang-punch apparatus. Conventional gang punch pins are typically about ½ inch long and have a diameter of about 0.003 inch to 0.008 inch and are permanently and rigidly affixed to the head. They are relatively expensive (about $1 each) and difficult to replace. Headed punches whose head is used to retain the punch pin in the punch head, allowing easy removal when necessary, are even more expensive (about $1–7 each). The punch pins of the present invention can be fabricated for typically about $ 0.01 each.

Bearing in mind the problems and deficiencies of the prior art, it is therefore an object of the present invention to provide a cost effective (typically about $0.01 each) and efficient method for making headed punch pins for use in punching apparatus such as a gang-punch apparatus for punching greensheets.

It is a further object of the present invention to provide an apparatus for making headed punch pins for use in punching apparatus such as a gang-punch apparatus for punching greensheets.

An additional object of the invention is to provide headed punch pins for use in methods and apparatus for punching vias in greensheets.

Other objects and advantages of the present invention will be readily apparent from the following description.

SUMMARY OF THE INVENTION

The above and other objects and advantages, which will be apparent to one of skill in the art, are achieved in the present invention which is directed to, in a first aspect, an apparatus for forming a punch retaining head ball (headed) at the end of a wire to form a punch pin for punching vias in greensheets comprising means to advance a wire through a die preferably a pair of communicating and cooperating dies so that a movable electrode moving toward the end of the wire completes an electrical circuit with the wire electrically heating and melting the wire and forming a ball at the end of the wire, the end of the wire then being retracted and held by the die which cuts the wire to the desired length, with the wire then being advanced and repeating the above steps.

A preferred apparatus to make a headed punch pin comprises:

wire moving means having a first longitudinal through hole through which a wire travels from a pay out reel or other wire source through a first end of the wire moving means and passes out an opposed second end and which means is movable back and forth along the axis of the wire;

a first wire clamping means associated with the wire moving means;

die containing means having a second longitudinal through hole in registration with the first longitudinal through hole through which the wire passing from the second end of the wire moving means travels through a first end of the die containing means to a second end thereof at which end is a first die having a cylindrical through hole with a diameter sufficient to accommodate the diameter of the wire;

a second wire clamping means associated with the die containing means;

wire cutting means preferably containing a second die in registration with the first die through which the wire passing through and exiting the first die travels through the second die having a diameter sufficient to accommodate the diameter of the wire but smaller than the diameter of the head to be formed on the wire;

electrode wire clamping means;

an electrode which is movable back and forth toward the end of the wire, preferably along the axis of the wire;

means for applying electrical energy to the electrode and the electrode wire clamping means;

optional means for supplying an inert gas to the end of the wire; and sensing means to determine if a ball of the required size is formed on the wire;

wherein a wire is extended through the wire moving means and die containing means and clamped by the first clamping means with the wire moving means being at an initial starting position and then the wire is advanced by the wire moving means through the wire cutting means past the electrode wire clamping means and clamped by the electrode wire clamping means, the electrode is moved toward the end of the wire and energy supplied completing a circuit between the end of the wire and the electrode causing an arc, the resulting energy supplied melts the wire, forming a ball at the end of the wire after which the wire moving means is retracted until the ball of the wire reaches the wire cutting means, preferably the second die and the wire is restricted from further movement by the size of the ball and the wire is cut to form the punch pin at which point the wire is clamped by the second wire clamping means and is released from the first wire clamping means and the wire moving means retracted to its starting position, the second wire clamping means being released and the process repeated.

In a preferred aspect of the invention, the apparatus further contains a moveable punch pin capture device having an opening therein which device is positioned after the formed punch pin is contained in the first and second die so the opening of the capture device is opposed to the second die opening to receive the cut formed punch pin. The capture device also has ejection means to eject the punch pin from the opening of the capture device into a punch pin transmitting tube connecting a punch pin holder which may be a container to hold the formed punch pins or a gang-punch or other punch assembly into which the pins are directed and aligned for punching.

In an additional aspect of the invention, the apparatus further contains a punch pin removal means situated near the second die opening to remove reject punch pins not having a proper ball formed at the end thereof. The removal means is preferably a vacuum device.

In an additional aspect of the invention, a method is provided for forming a ball at the end of a wire to form a punch pin for punching vias in greensheets comprising the steps of:

providing an apparatus for forming a ball at the end of a wire comprising the apparatus as described above;

extending a wire through the wire moving means and through the first die with the wire moving means then being in a starting position;

clamping the wire using the first clamping means;

advancing the wire moving means pushing the wire through the wire cutting means and past the electrode wire clamping means;

clamping the wire with the electrode wire clamping means;

optionally feeding an inert gas to the end of the wire;

moving the electrode toward the end of the wire actuating an electrical circuit preferably at the instant of contact to melt the end of the wire to form the ball;

releasing the wire from the electrode wire clamping means;

retracting the wire moving means until the ball stops travel of the wire when the ball reaches the wire cutting means;

securing the wire by the second wire clamping means;

determining movement of the wire relative to the first die by using the sensing means;

cutting the wire forming the punch pin if the wire is restricted by the size of the ball from movement through the first die toward the wire moving means;

collecting the formed punch pin;

disengaging the wire from the first wire clamping means;

retracting the wire moving means to its starting position;

disengaging the wire from the second wire clamping means; and repeating the above steps.

In another aspect of the method of the invention, the method further includes the steps of:

providing the apparatus with a movable punch pin capture device;

moving the capture device opposite the second die opening after the formed punch pin has been cut;

receiving the formed punch pin into the capture device;

retracting the capture device to a position in alignment with the punch pin transmitting tube; and ejecting the formed punch pin from the capture device through the punch pin transmitting tube into a punch pin holding container.

In an additional aspect of the method of the invention, the apparatus is further provided with a punch pin removal means for reject punch pins not having a proper ball at the end thereof. The device is preferably a vacuum tube situated near the second die opening to receive the defective punch pin when it is determined the punch pin is defective.

The punch pins are preferably used in a gang punch apparatus as described in a patent application filed on even date herewith entitled Low-Cost High-Density Gang Punch assigned to the assignee of the present invention. The gang punch is likewise preferably used in an assembly for punching green sheets as described in a patent application filed on even date herewith entitled Gang Punch Tool Assembly and assigned to the assignee of the subject invention.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
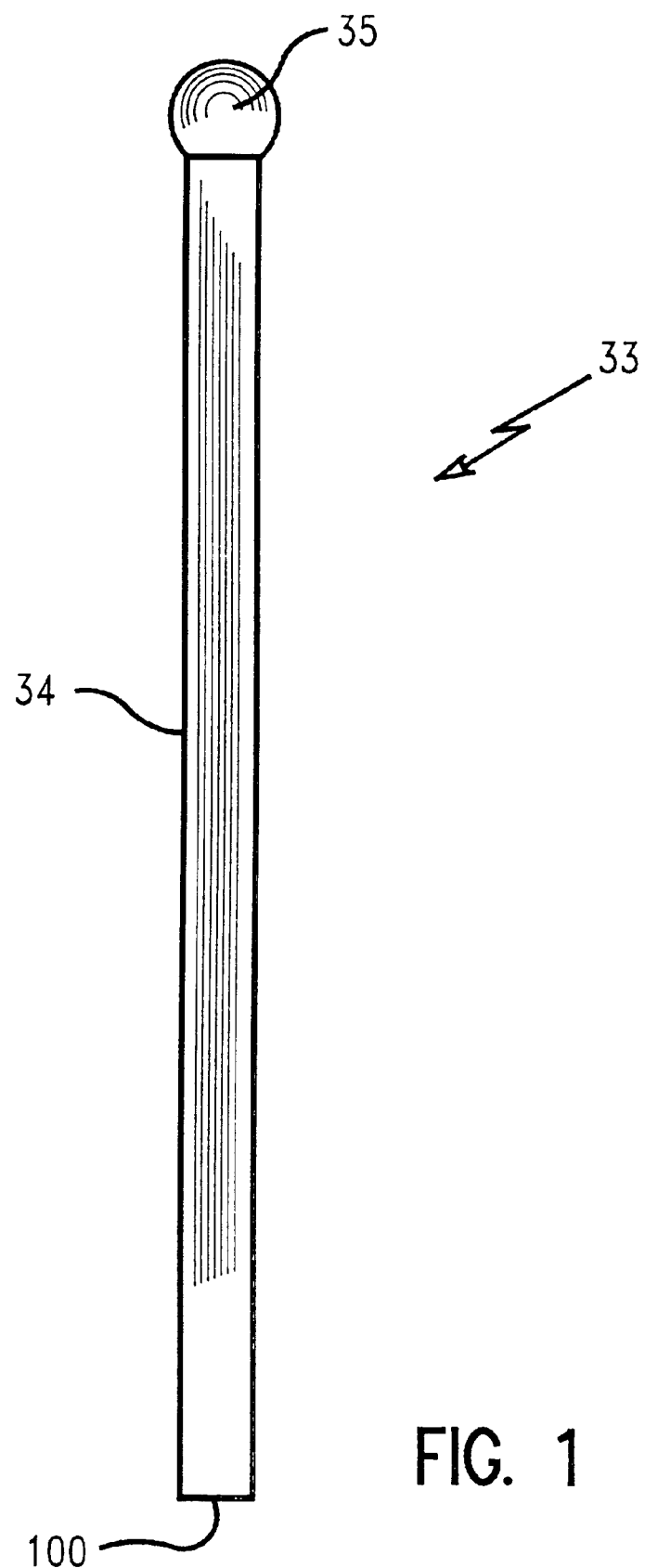
FIG. 1 shows a punch pin formed according to the method and apparatus of the invention.

In describing the preferred embodiment of the present invention, reference will be made herein to FIGS. 1–7 of the drawings in which like numerals refer to like features of the invention. Features of the invention are not necessarily shown to scale in the drawings.

Referring to FIG. 1, a punch pin made by the method and apparatus of the invention is shown. The punch pin shown generally as 33 comprises an elongated shank or stem 34 having a ball 35 at one end thereof and an opposed squarely cut-off end 100. The diameter of the ball 35 is slightly larger than the diameter of the stem, typically about 0.002 inch larger. The stem is typically 0.003 inch–0.008 inch in diameter, but may be smaller or larger for certain applications. It is preferred that the stem be about 0.025 inch to 0.250 inch, preferably about 0.100 inch long. A conventional prior art punch pin is about 0.600 inch long. The punch pin may be made from any suitable material such as tungsten, tungsten alloys, steel, beryllium, titanium, etc., preferably tungsten.

Additionally, the wire used to make the punch may be specially treated or coated to either enhance the ball end forming process, such as materials that emit inert atmosphere when heated, or those that are hard coated or alloyed.

Figure 2A:
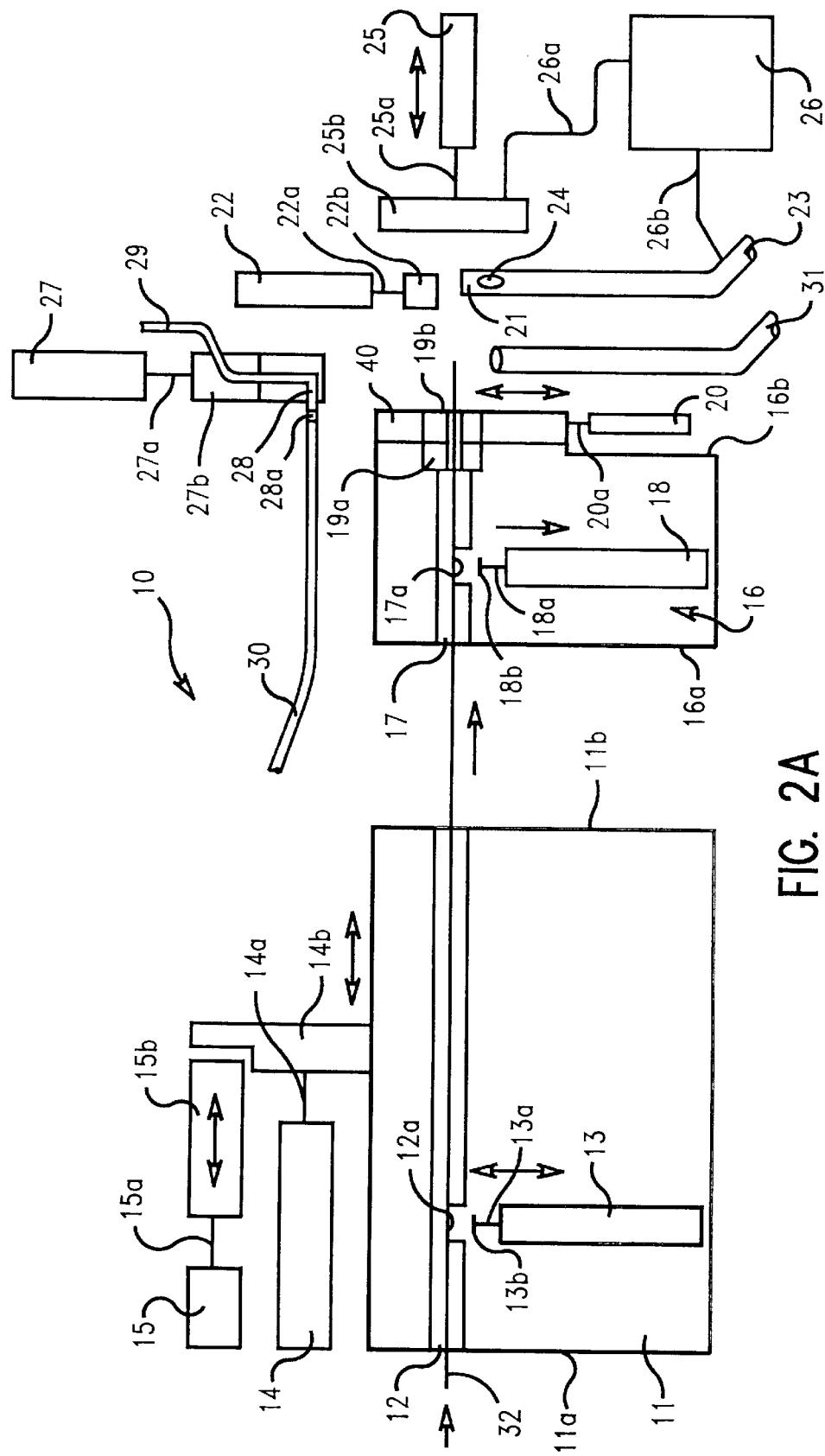
FIGS. 2A–2D show the apparatus of the invention in schematic form and the use of the apparatus to continuously form spherical headed punch pins.
Figure 2B:
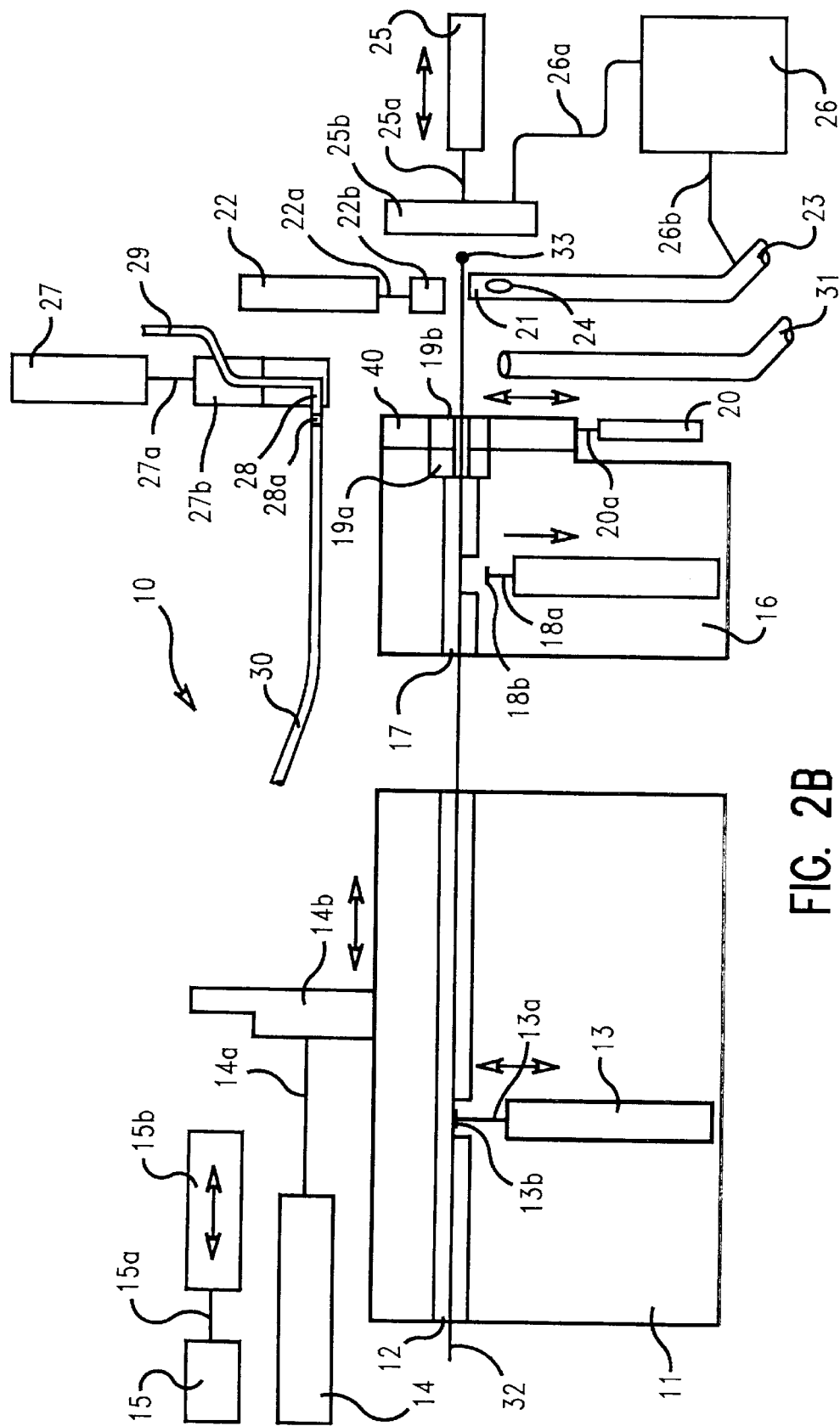

Referring to FIGS. 2A and 2B, an apparatus of the invention is shown generally as 10. A wire moving means 11 has a horizontal through hole 12 extending from a first end 11a of the wire moving means where the wire enters from a wire supply such as payout reel to the other opposed end 11b. The horizontal through hole 12 is slightly larger than the wire 32 to permit movement of the wire through the through hole. A clamp piston 13 is shown having a piston rod 13a and wire clamping member 13b. The horizontal through hole 12 has an opening or notch 12a intersecting about half its diameter in registration with wire clamping member 13b, allowing wire clamping member 13b to clamp wire 32 stationary with respect to moving means 11 when cylinder 13 is activated. When piston 13 is activated, rod 13a is extended or retracted as shown by the arrows so that the clamping member 13b will either secure the wire in place in wire moving means 11 or be in a retracted position allowing the wire 32 to move freely through hole 12. The wire is fed from a wire feeder (not shown) into wire moving means 11 in the direction of arrow A.

A die containing means 16 having an end 16a and another end 16b has a horizontal through hole 17 which is essentially the same diameter and in registration with horizontal through hole 12 of wire moving means 11. Opening or notch 17a allows clamping member 18b access to wire 32 in a similar manner as opening 12a. At the end 16b of die containing means furthest away from wire moving means 11 is a die 19a through which the wire travels through. The die containing means 16 has associated therewith a piston 18, piston rod 18a and clamping member 18b which is used to either secure the wire relative to die containing means 16 or to allow the wire to move freely through die containing means 16. A wire cutting means 40 contains a second die 19b in close proximity to and in registration with the first die 19a through which the wire 32 travels through.

The wire cutting means 40 has associated therewith a wire cutting piston 20 and a wire cutting piston rod 20a which, when activated, will shear the wire by longitudinally displacing die which 19b relative to die 19b. Other means can be used to cut the wire such as a grinding wheel.

Figure 3A:
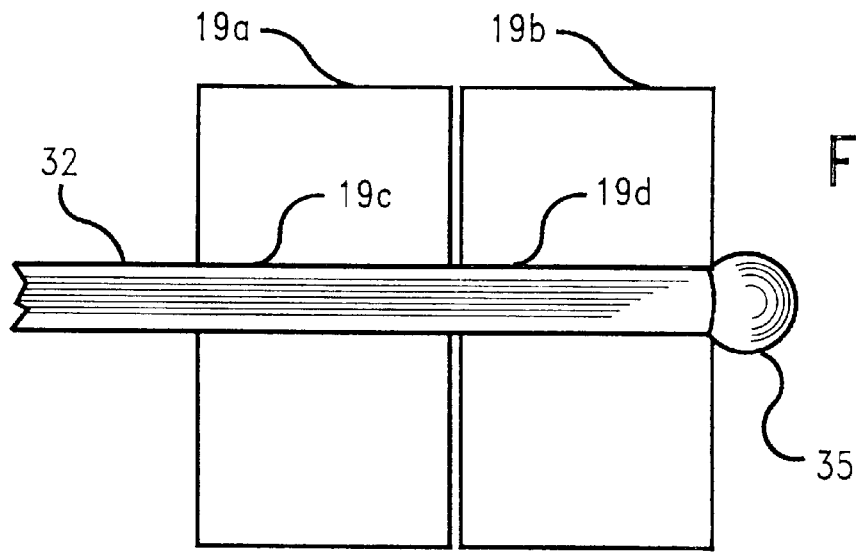
FIGS. 3A and 3B show wire cutting dies of the apparatus in operation.
Figure 3B:
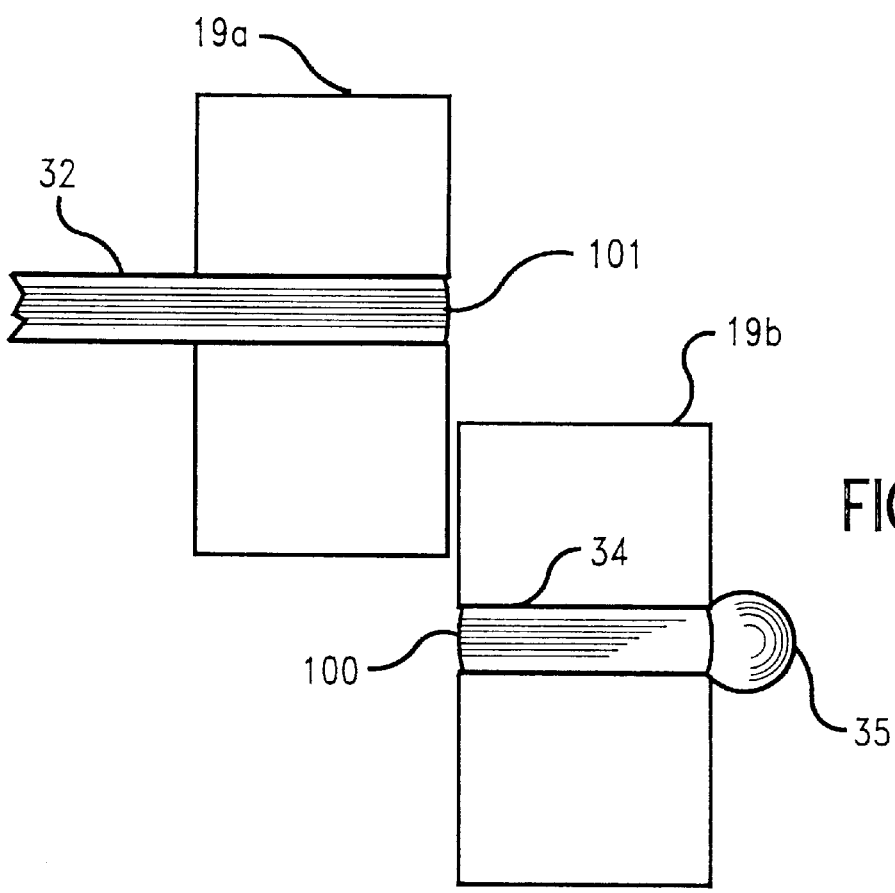

An enlarged view of the dies in die containing means 16 and wire cutting means 40 is shown in FIGS. 3A and 3B. Die 19b is rigidly attached to die containing means 16 and die 19b is attached to moveable wire cutting piston rod 20a and cutting piston 20 of wire cutting means 40. As shown in FIGS. 3A and 3B, with through holes 19c and 19d in dies 19b and 19b aligned, wire 32 can move axially through holes 19c and 19d. Wire cutting piston 20 and piston rod 20a are actuated, pulling die 19b perpendicular to holes 19c and 19d. As holes 19c and 19d become misaligned, the wire 32 is sheared, forming the square end 100 of punch 33 and square end 101 of wire 32. Spherical head 35 prevents movement of punch pin 33 through dies 19b and 19b because head 35 is larger than through hole 19d.

Referring again to FIG. 2A, a rejected part removal device, typically a vacuum device, is shown as 31 and its use will be described hereinafter.

An electrode wire clamp support post 21 is used in conjunction with electrode clamp piston 22, electrode clamp piston rod 22a and electrode clamp member 22b.

An electrode piston 25, electrode piston rod 25a and electrode 25b are shown movable back and forth along the axis of the wire. An energy source 26 is electrically connected to electrode 25b by wire 26a and to electrode clamp support 21 by wire 26b. Wire 32 is clamped by support 21 and clamp 22b and the electrode 25b is advanced sufficiently toward the wire; upon contact an electrical pulse circuit is generated by energy source 26 and applied between the end of the wire 32 and the electrode 25b melting the wire and thereby forming a ball at the end of the wire. Electrode wire clamp support 21 is shown having a bore therein so that an inert gas supply 23 may be fed to electrode clamp support 21 which gas exits at opening 24 purging the area surrounding 22b and 25b.

A punch pin capture device piston 27 has a piston rod 27a and a capture device 27b. The capture device 27b has a cavity 28 with opening 28a at the lower end thereof for receiving a formed punch pin. An air supply source 29 communicating with cavity 28 will be used to eject a captured formed punch pin from opening 28a into punch pin transmitting tube 30. Reject part removal device shown as 31 removes a rejected punch pin from the die 19b using a vacuum.

Referring again to FIG. 2A, operation of the apparatus may be demonstrated. Clamp 13b is actuated to secure wire 32 in wire moving means 11 and the wire moving means 11 is advanced (moved to its extreme position) by first piston 14 and piston rod 14a pushing integral member 14b as shown in FIG. 2B. Wire 32 is extended past electrode wire clamp support post 21. Electrode wire clamp piston 22 is activated to engage and secure the electrode clamp 22b with wire 32 and electrode clamp support post 21. Electrode piston 25 would then be momentarily activated moving the electrode 25b toward the end of wire 32.

Upon contact of wire 32 with electrode 25b, an electrical pulse is generated by energy source 26, causing an arc to occur between wire and electrode, causing the wire to melt and form a ball at the end of wire 32 shown as 35 in FIG. 3A.

Figure 4A:
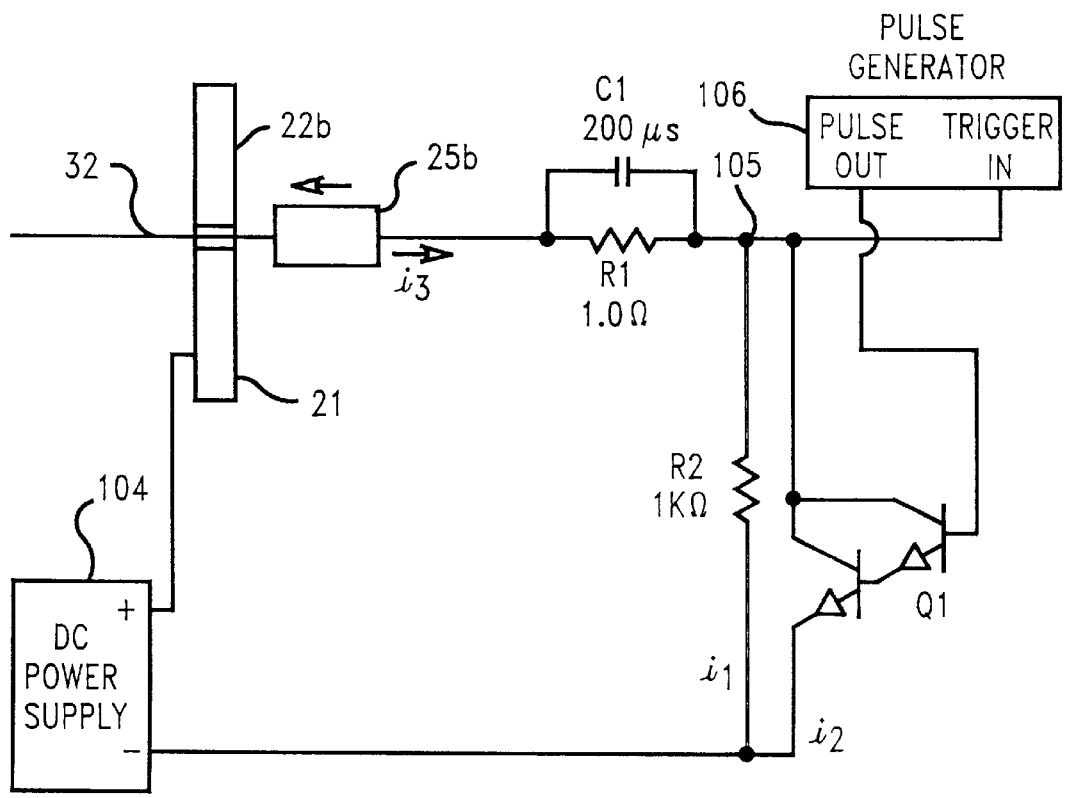
FIGS. 4A and 4B show the electrical circuits (4A) of the energy source and resulting current waveforms (4B).

FIG. 4A is a schematic diagram showing a first embodiment of energy source 26.

In this first embodiment, the pulse energy circuit provides a first high current pulse to initiate the arc. This is provided by the stored energy in capacitor C1. It has been found, however, that with the relatively high melting temperature of the preferred material (i.e., tungsten), the high energy required to reliably initiate the arc is too great and results in a ball end that is too large and poorly controlled.

Referring to FIG. 4A, initially, the wire 32 is clamped between post 21 and clamp 22b and whose end is in close proximity to moveable electrode 25b. The wire is now at a potential of approximately +45 VDC.

Electrode 25b is slowly advanced toward wire end 32 until electrical contact is made. A small current i1 will begin to flow through 25b, R1/C1, R2 to the negative terminal of the DC power supply 104. Alternatively, the moveable electrode can be replaced with any relative movement between the wire and the electrode.

The voltage at point 105 rises to approx. +45 volts. This voltage rise triggers pulse generator 106. The output of the pulse generator is positive going and forward biases the darlington transistor Q1 and causes a large current i2 to flow from R1/C1, through Q1 and back to the DC power supply 104.

Figure 4B:
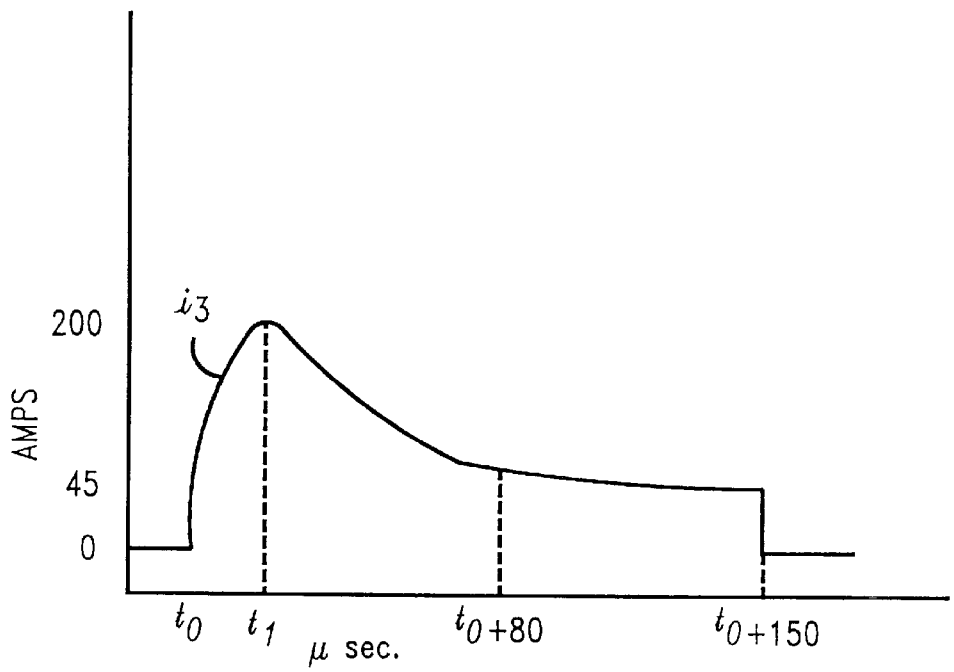

FIG. 4B is a graph of the current i3 flowing through wire 32.

At time t0, the electrode 25b touches wire 32 at which time the darlington transistor Q1 is gated on. The high peak current (approx. 200 A) at time t1 is produced by the rapid charge of capacitor C1 which is required to initiate the arc. The energy supplied through capacitor C1 diminishes after approximately 80 microseconds as shown as time t0+80 and a sustained current of approximately 45A is provided through current limiting resistor R1, sustaining the arc and subsequent melting of the wire 32.

This arc and melting would normally continue for several milliseconds resulting in a spherical end many times larger than desired unless interrupted. To terminate this arc, and finely control the size of the head, Q1 is gated off after a preset duration (typically 150 microseconds).

These times would be adjusted for specific wire materials, diameters and desired head sizes. The DC voltage, and values of C1 and R1 can also be varied to obtain the desired results.

In addition, purging the area surrounding the arc with an inert gas such as nitrogen, oxidation of the wire and burning of the metal is essentially eliminated and results in the formation of a smooth highly spherical head. Additionally, it has been found that electrode 25b is preferably advanced slowly to prevent the wire from welding to the electrode.

Figure 5A:
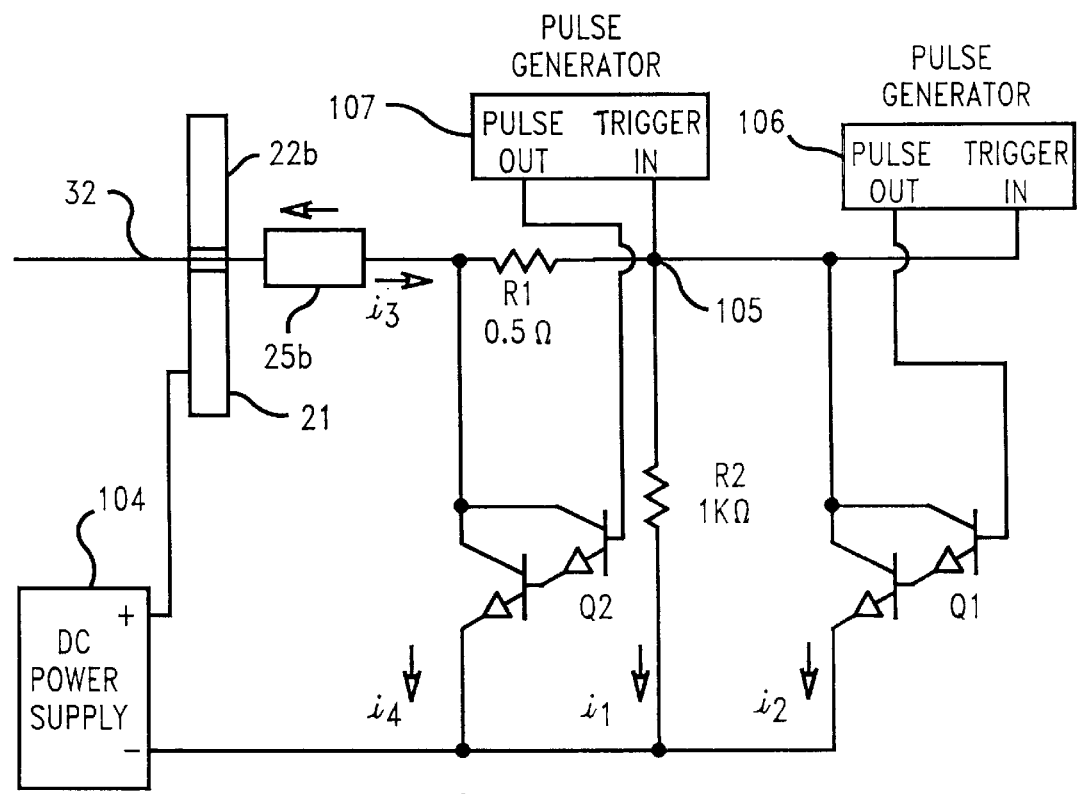
FIGS. 5A and 5B show a preferred embodiment of the electrical circuit (5A) of the energy source and resulting current waveforms (5B–5D).

Although the above circuit produces spherical heads the yield of the process can be improved. A more desirable embodiment of the present circuit is shown in FIG. 5A.

In this embodiment, the capacitor C1 with its inherent effective series resistance current limiting problems, is replaced by an additional darlington transistor Q2 which provides a more controllable, and even higher amplitude/shorter width initial current pulse, and also provides quicker and easier process optimization.

Figure 5B:
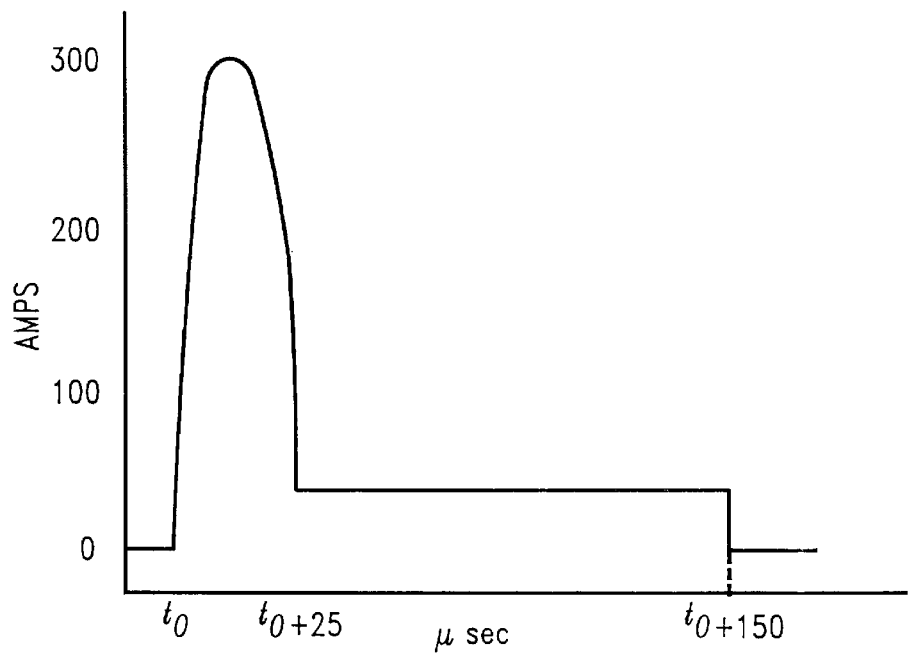

Using pulse generator 107 to gate Q2 on and off, the rise time and pulse width of the current pulse is independent of the pulse amplitude. The benefit of this is that a shorter time, higher amplitude current pulse results in a more reliable arc initiation without increasing the diameter of the spherical head. The resulting current waveform is shown in FIG. 5B.

Although this improves the reliability of the arc initiation, further improvements in yield can be realized.

Figure 6A:
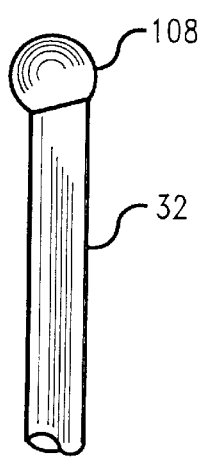
FIGS. 6A–6C show side elevational views of formed punch heads.

As a result of using dies 19a and 19b to cut the wire, the resulting end of the punch on which the head to be formed is approximately square to the axis of the wire 32. The arc ignition can start on any edge of the wire that contacts the electrode first. This off-center arc initiation often results in a lop-sided head 108 as illustrated in FIG. 6A.

An even more desirable embodiment of the present invention is described hereinafter.

Figure 6B:
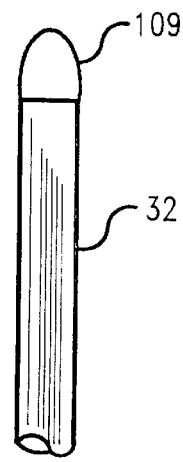
Figure 6C:
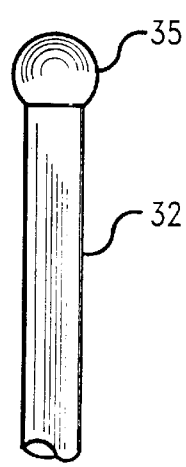

It has been found that when forming a head on wire 32 without the presence of an inert gas (such as nitrogen gas), the resulting end is bullet shaped 109, but has its tip centered on the axis of the wire 32 as shown in FIG. 6B. Although unacceptable as a final head shape, it provides an excellent geometry for initiating a subsequent arc at the center of the wire axis. In the presence of an inert gas, this second pulse results in a perfectly centered spherical head as shown in FIG. 6C.

If desired, the current can be increased to form "football" shaped ends where the diameter of the melted end is larger than the punch shank, but the tip is tapered.

This improved two pulse two gas method requires that the first and second pulse be individually tailored to provide the desired result.

Figure 5C:
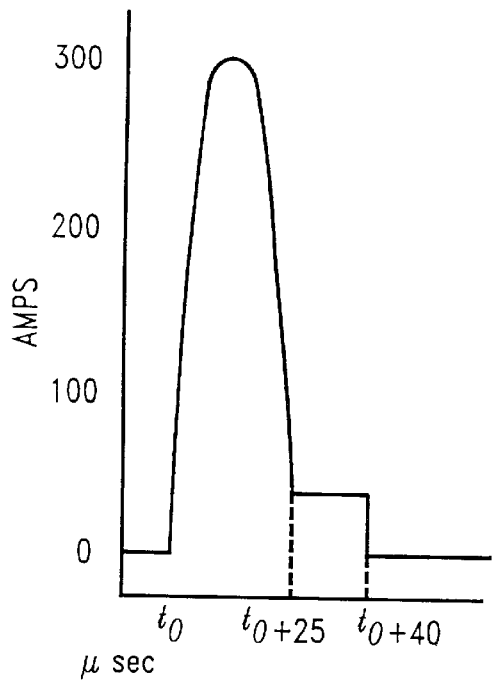

Referring to FIG. 5C, to form the bullet nose wire as in FIG. 6B, it was found that a shorter pulse width than used for the single pulse method was required. This shorter pulse (typically about 40 microseconds) is required to minimize the size of the bullet shaped head. It is important so that the overall size of the resulting head of the second step is not too large. Also, it is necessary to perform this first pulse in the presence of normal atmosphere (air) to obtain the bullet shape.

Figure 5D:
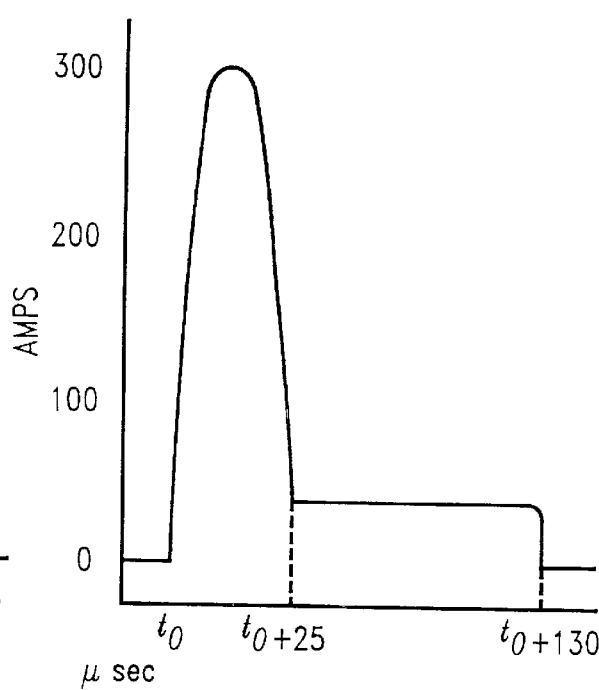

The second pulse as shown in FIG. 5D is of slightly shorter duration, typically 130 microseconds, than that of the one pulse method shown in FIG. 5B. This second pulse is performed in the presence of an inert gas purge.

The shorter duration is required so that the resultant spherical end is of the same size as that of the single pulse method.

The spherical head, however, is perfectly centered and asymmetrical to the axis of the wire as shown in FIG. 6C.

The inert gas is fed during the melting process through line 23 and exits at opening 24 impinging upon the end of the wire 32.

Figure 2C:
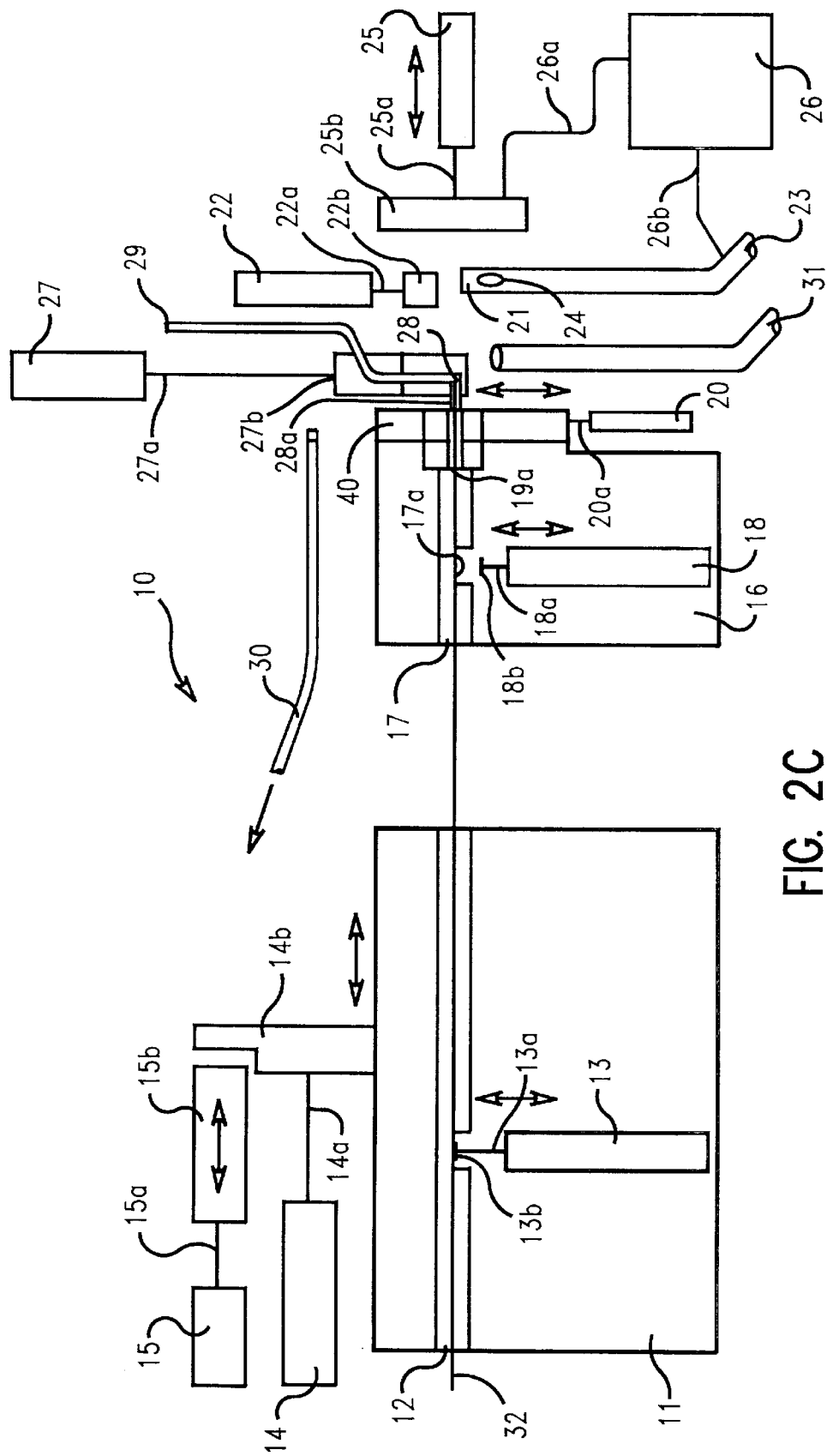

Referring now to FIG. 2C, wire moving means 11 has been retracted to almost its starting position of FIG. 2A and the formed punch pin and wire moving means 11 is restricted from further movement by the head 35 of wire 32 not being able to move through the die 19b. This can be seen in FIG. 3A. A position sensing means (not shown) is used to determine if the wire moving means 11 has fully retracted to its starting position of FIG. 2A. If wire moving means 11 is in its fully retracted position, this will indicate that the formed head 35 (or lack thereof) was too small to restrict the wire 32 from moving through the die 19b and that the formed punch pin is a reject. An optical sensing means of inspection could be used to determine if a formed head is acceptable. If the sensing means (not shown) indicates that a proper punch pin has been formed, clamping member 18b of die containing means 16 is activated to secure wire 32. At the same time, capture device piston 27 is actuated, moving capture device 27b so that the opening 28a of cavity 28 is opposite the elongated opening in die 19b. The wire cutting piston 20 of wire cutting means 40 is retracted causing die 19b to move perpendicular to the die opening of 19a, causing the wire 32 to be sheared as shown in FIG. 3B. Piston 20 is then extended causing die 19b to return to its aligned position with die 19a. During this shearing process, the air supply 29 would be momentarily activated to blow on the punch pin head to ensure that the formed punch pin 33 remains in die 19b. The length of the punch shank 34 is determined by the length of die 19b. Clamp 13b is retracted, allowing wire moving means 11 to return to its starting position. Because clamp 18b is still actuated, the wire 32 remains stationary. Alternately, in place of die member 19a or interposed between die 19a and 19b a rotating abrasive cut-off wheel may be introduced to cut the punch shank 34 to the proper length. After wire moving means 11 has returned to its starting position, clamp 13b is activated and clamp 18b is retracted. Second piston 15 is shown in FIG. 2C being momentarily activated moving the wire moving means 11 slightly forward pushing the formed punch pin into opening 28a of cavity 28 of capture device 27b.

Figure 2D:
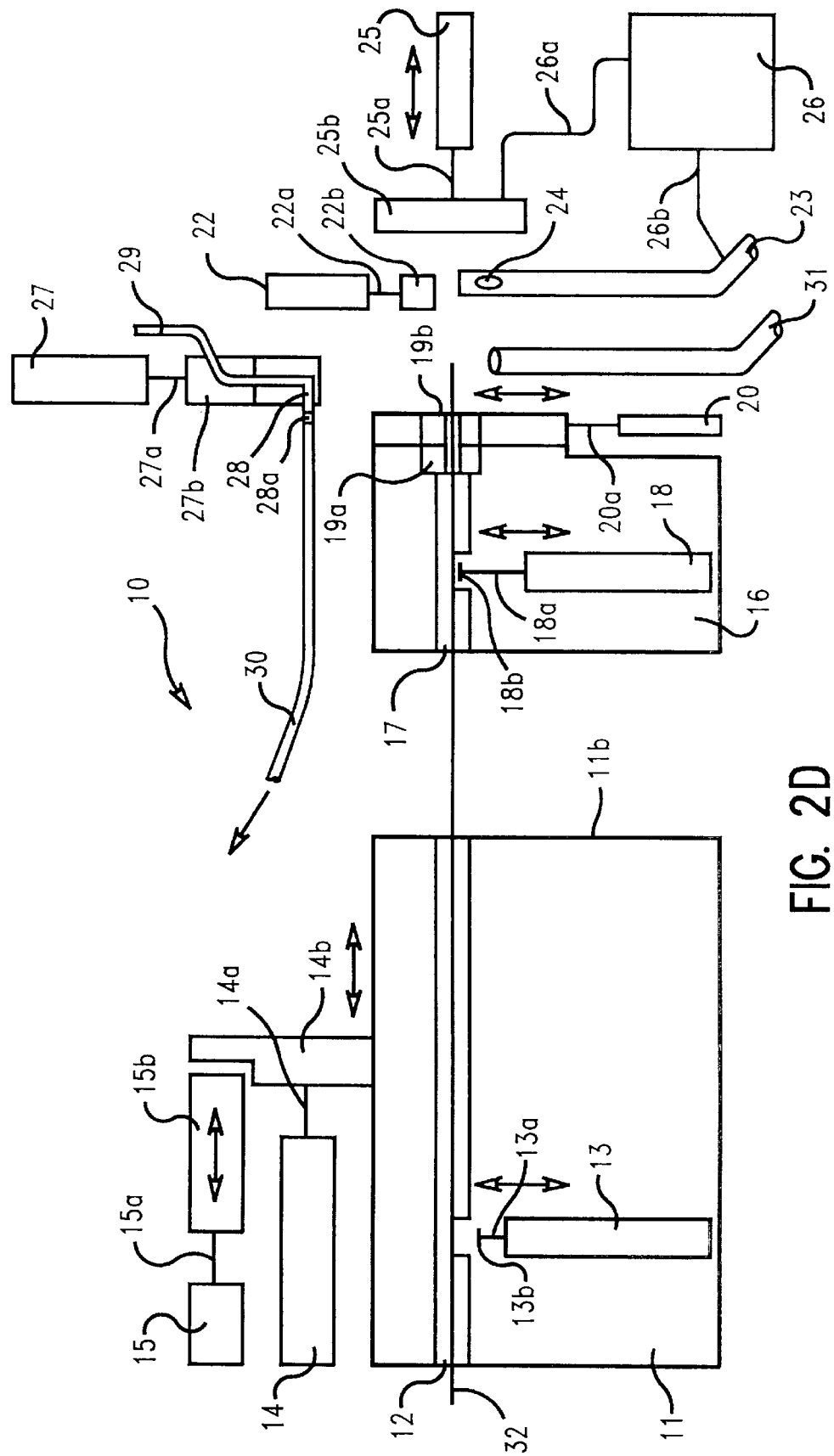

Referring now to FIG. 2D, a formed punch pin 33 is now in cavity 28 of capture device 27b. The capture device 27b has been retracted by piston 27 to align with punch pin transmitting tube 30. Air supply 29 would be activated to eject the punch pin from opening 28a through punch pin transmitting tube 30 to a receiver (not shown). If the formed punch pin was a reject because an acceptable ball was not formed at the end of the wire or for other reasons, the capture device 27b would not have been activated. Instead the reject punch pin would have been forced from die 19b by second piston 15 and captured by reject part removal device 31.

Figure 7:
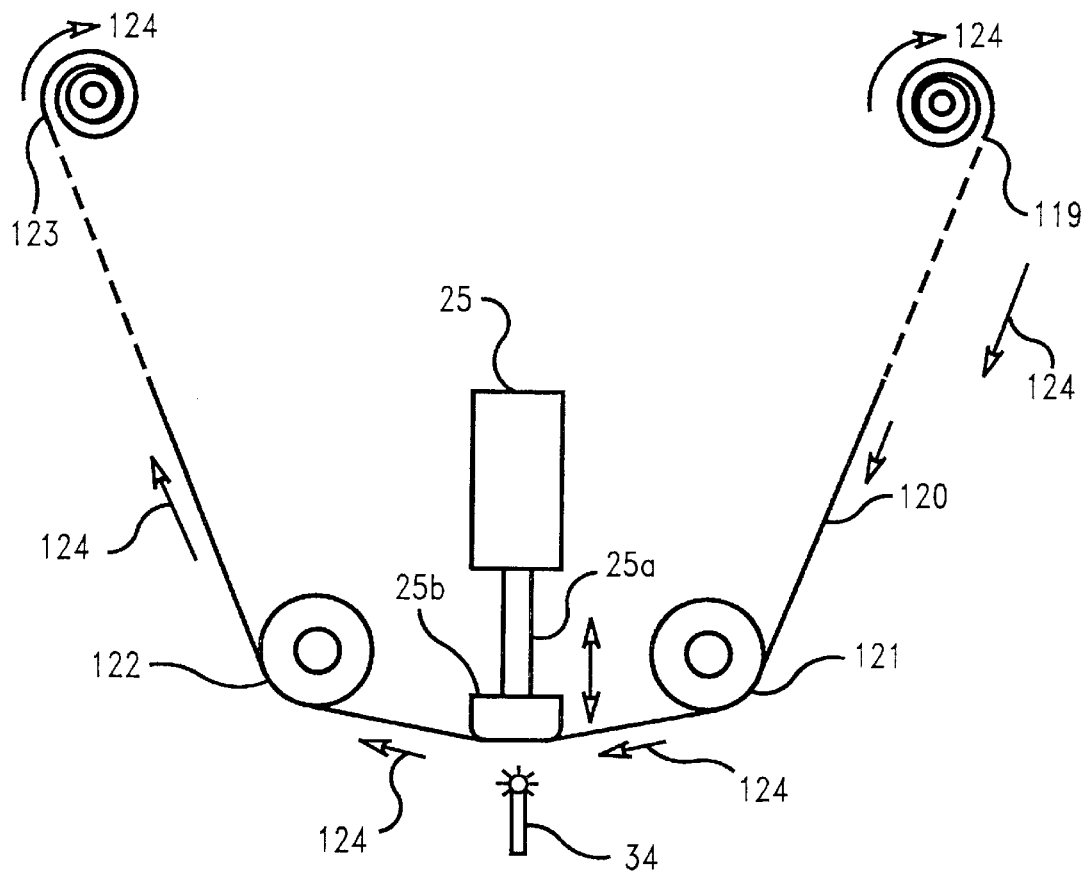
FIG. 7 shows a preferred renewable electrode apparatus.

In the process of forming the punch head, the arc typically creates a pit on the electrode 25b. Additionally, when the arc is formed without the purge gas, metal oxides are deposited on the electrode 25b as well. Both the pits on the electrode and the metal oxides deposited on the surface electrically insulate the electrode and make it difficult to form subsequent arcs. An alternate embodiment of the present invention incorporating a renewable electrode portion is shown in FIG. 7. A conductive flat wire 120 is comprised of any of a variety of copper alloys of other suitable materials such as gold plated copper, is pre-wound on a supply reel 119. It is fed across roller 121 and across and in electrical contact with the face of electrode 25b. It is further fed across roller 122 and wound onto take up reel 123.

After the completion of each head forming arc, the supply and take-up reels are incrementally advanced by electrical or mechanical means in the direction indicated by arrows 124. This provides a new surface on the electrode for forming each arc and results in a more reliable and uniform arc and corresponding spherical head.

The above procedure is then continued until the desired number of punch pins are formed.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An apparatus for forming a punch retaining ball at the end of a wire to form a punch pin for punching vias in greensheets comprising means to advance a wire through a die so that a movable electrode moving toward the end of the wire forms an electrical circuit with the wire melting the wire and forming the ball at the end of the wire, the end of the wire then being retracted and held by the die which cuts the wire to the desired length, with the wire then being advanced and repeating the above steps.

2. An apparatus for forming a punch retaining ball at the end of a wire to form a punch pin for punching vias in greensheets comprises:

wire moving means having a first longitudinal through hole through which a wire travels from a pay out reel or other wire source through a first end of the wire moving means and passes out an opposed second end and which means is movable back and forth along the axis of the wire;

a first wire clamping means associated with the wire moving means;

die containing means having a second longitudinal through hole in registration with the first longitudinal through hole through which the wire passing from the second end of the wire moving means travels through a first end of the die containing means to a second end thereof at which end is a first die having a cylindrical through hole with a diameter sufficient to accommodate the diameter of the wire;

a second wire clamping means associated with the die containing means;

wire cutting means;

electrode wire clamping means;

an electrode which is movable back and forth toward the end of the wire;

means for applying electrical energy to the electrode and the electrode wire clamping means;

means for supplying an inert gas to the end of the wire; and sensing means to determine if a ball of the required size is formed on the wire;

wherein a wire is extended through the wire moving means and die containing means and clamped by the first clamping means with the wire moving means being at an initial starting position and then the wire is advanced past the electrode wire clamping means and clamped by the electrode wire clamping means, the electrode is moved toward the end of the wire and energy supplied forming an arc or circuit between the end of the wire and the electrode forming a ball at the end of the wire after which the wire moving means is retracted until the ball of the wire reaches the open wire cutting means and the wire is restricted from further movement by the size of the ball and the wire is cut to form the punch pin at which point the wire is clamped by the second wire clamping means and is released from the first wire clamping means and the wire moving means retracted to its starting position the second wire clamping means being released and the process repeated.

3. The apparatus of claim 2 further comprising a punch pin capture device for receiving the cut formed punch pin.

4. The apparatus of claim 3 further comprising a punch pin removal means.

5. The apparatus of claim 2 wherein a conductor strip movable across the surface of the electrode facing the wire which strip is moved incrementally after forming one or more spherical headed punch pins to expose a new portion of the strip to the wire.

6. The apparatus of claim 2 wherein a second die is used in communication with and cooperating with the first die as the wire cutting means to cut the wire after a head has been formed on the wire, the second die having a through opening which is smaller than the formed head.

7. The apparatus of claim 2 wherein energy is supplied in two steps, the first in a non-inert atmosphere and the second in an inert atmosphere.

8. The apparatus of claim 2 wherein the means of supplying electrical energy is controlled to provide an initial current to flow between the electrode and wire followed by a second larger current.

9. The apparatus of claim 2 wherein the wire cutting means is a grinding wheel.

10. A method is provided for forming a punch retaining ball at the end of a wire to form a punch pin for punching vias in greensheets comprising the steps of:

providing an apparatus for forming a ball at the end of a wire comprising the apparatus of claim 2;

extending a wire through the wire moving means and through the die opening with the wire moving means then being in a starting position;

clamping the wire using the first clamping means;

advancing the wire moving means pushing the wire through and past the electrode wire clamping means;

clamping the wire with the electrode wire clamping means;

feeding an inert gas to the end of the wire;

moving the electrode toward the end of the wire actuating an electrical circuit to melt the end of the wire to form the ball;

releasing the wire from the electrode wire clamping means;

retracting the wire moving means until the ball stops travel of the wire when the ball reaches the wire cutting means;

securing the wire by the second wire clamping means;

determining movement of the wire relative to the die by using the sensing means;

cutting the wire forming the punch pin if the wire is restricted from movement past the first die toward the wire moving means;

collecting the formed punch pin;

disengaging the wire from the first wire clamping means;

retracting the wire moving means to its starting position;

disengaging the wire from the second wire clamping means; and repeating the above steps.

11. The method of claim 10 including the steps of:

providing the apparatus with a movable punch pin capture device;

moving the capture device opposite the die opening after the formed punch pin has been cut;

receiving the formed punch pin into the capture device; and ejecting the formed punch pin from the capture device to a punch pin holding container.

12. The method of claim 10 including the steps of:

providing the apparatus with punch pin removal means for reject pins not having a proper ball size at the end thereof; and ejecting the reject punch pin from the die to the removal means.

13. The method of claim 10 wherein the energy is supplied in the electrical circuit in two steps, the first in a non-inert atmosphere and the second in an inert atmosphere.

14. The method of claim 13 wherein the energy is controlled to provide an initial current to flow between the electrode and the wire followed by a second larger current.

* * * * *